United States Patent
Ahn et al.

(10) Patent No.: US 8,000,163 B2
(45) Date of Patent: Aug. 16, 2011

(54) SELF REFRESH OPERATION OF SEMICONDUCTOR MEMORY DEVICE

(75) Inventors: Jin-Hong Ahn, Kyoungki-do (KR); Bong-Hwa Jeong, Kyoungki-do (KR); Saeng-Hwan Kim, Kyoungki-do (KR); Shin-Ho Chu, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 12/724,393

(22) Filed: Mar. 15, 2010

(65) Prior Publication Data

US 2010/0188914 A1 Jul. 29, 2010

Related U.S. Application Data

(62) Division of application No. 11/786,594, filed on Apr. 12, 2007, now Pat. No. 7,710,809.

(30) Foreign Application Priority Data

Apr. 14, 2006 (KR) .................. 10-2006-0034104

(51) Int. Cl.
*G11C 7/00* (2006.01)
*G11C 8/00* (2006.01)
(52) U.S. Cl. .............. 365/222; 365/189.07; 365/189.12; 365/230.03; 365/240
(58) Field of Classification Search ............. 365/189.07, 365/189.12, 222, 230.03, 240
See application file for complete search history.

(56) References Cited

U.S. PATENT DOCUMENTS

| 4,357,686 A * | 11/1982 | Scheuneman | 365/222 |
|---|---|---|---|
| 4,498,155 A * | 2/1985 | Mohan Rao | 365/240 |
| 4,701,843 A * | 10/1987 | Cohen | 365/222 |
| 5,083,296 A * | 1/1992 | Hara et al. | 365/222 |
| 5,636,173 A | 6/1997 | Schaefer | 365/222 |
| 5,901,101 A | 5/1999 | Suzuki et al. | 365/222 |
| 6,246,619 B1 | 6/2001 | Ematrudo et al. | 365/201 |
| 6,310,814 B1 * | 10/2001 | Hampel et al. | 365/222 |

(Continued)

FOREIGN PATENT DOCUMENTS

CN 1536576 10/2004

(Continued)

OTHER PUBLICATIONS

"Dual-Period Self-Refresh Scheme for Low-Power DRAM's with On-Chip PROM Mode Mode Register" by Youji Idel et al., *IEEE Journal of Solid-State Circuits*, vol. 33, No. 2, Feb. 1998, pp. 253-259.

*Primary Examiner* — Trong Phan
(74) *Attorney, Agent, or Firm* — Blakely, Sokoloff, Taylor & Zafman

(57) ABSTRACT

A method for driving a semiconductor memory device, includes initializing first data corresponding to a refresh time of each corresponding row included in a cell array; storing second data corresponding to column data included in the first row after entering a self refresh mode; setting the first data corresponding to the first row by detecting the refresh time of the first row while performing refresh operations on the other rows in the cell array according to a refresh period selected based on the corresponding first data for predetermined refresh cycles, wherein the refresh operation is not performed on the first row during the predetermined refresh cycles; restoring the second data to the first row; and repeating the above steps for the other rows to thereby set the corresponding first data until the setting step is completed for all rows or the self refresh mode expires.

2 Claims, 10 Drawing Sheets

U.S. PATENT DOCUMENTS

| | | |
|---|---|---|
| 6,349,068 B2 | 2/2002 | Takemae et al. ............... 365/222 |
| 6,404,688 B2 | 6/2002 | Okuyama et al. ............. 365/222 |
| 6,412,048 B1 * | 6/2002 | Chauvel et al. ............... 365/222 |
| 6,519,201 B2 | 2/2003 | Cowles et al. ................ 365/222 |
| 6,542,425 B2 | 4/2003 | Nam ............................. 365/222 |
| 6,597,617 B2 | 7/2003 | Ooishi et al. ................. 365/222 |
| 6,611,470 B2 * | 8/2003 | Hidaka ......................... 365/222 |
| 6,622,197 B1 | 9/2003 | Kim ............................ 365/238.5 |
| 6,697,992 B2 | 2/2004 | Ito et al. ....................... 365/222 |
| 6,721,223 B2 | 4/2004 | Matsumoto et al. .......... 365/222 |
| 6,771,553 B2 * | 8/2004 | Cowles et al. ................ 365/222 |
| 6,898,141 B2 * | 5/2005 | Tsukada ....................... 365/222 |
| 6,898,663 B2 * | 5/2005 | Winograd et al. ............ 365/222 |
| 6,965,537 B1 * | 11/2005 | Klein et al. ................... 365/222 |
| 6,992,943 B2 | 1/2006 | Hwang et al. ................ 365/222 |
| 7,013,363 B2 | 3/2006 | Janzen ......................... 365/222 |
| 7,043,599 B1 * | 5/2006 | Ware et al. ................... 365/222 |
| 7,079,439 B2 * | 7/2006 | Cowles et al. ................ 365/222 |
| 7,082,073 B2 * | 7/2006 | Casper ......................... 365/222 |
| 7,120,761 B2 | 10/2006 | Matsuzaki et al. ............ 365/222 |
| 7,158,433 B2 | 1/2007 | Riho et al. .................... 365/222 |
| 7,184,352 B2 * | 2/2007 | Klein et al. ................... 365/222 |
| 7,688,662 B2 * | 3/2010 | Mobley ........................ 365/222 |
| 2003/0135699 A1 | 7/2003 | Matsuzaki et al. |
| 2005/0219890 A1 | 10/2005 | Riho et al. |

FOREIGN PATENT DOCUMENTS

| | | |
|---|---|---|
| KR | 1995-0021587 | 7/1995 |
| KR | 1997-0051182 | 7/1997 |
| KR | 1999-0047956 | 7/1999 |
| KR | 2000-0004872 | 1/2000 |
| KR | 10-2004-0101677 | 12/2004 |
| KR | 2005-0118526 | 12/2005 |

* cited by examiner

SELF REFRESH OPERATION OF SEMICONDUCTOR MEMORY DEVICE

CROSS-REFERENCE TO RELATED APPLICATION

The present patent application is a Divisional Application claiming the benefit of application Ser. No. 11/786,594, filed Apr. 12, 2007, now U.S. Pat. No. 7,710,809 issued May 4, 2010, which claims priority of Korean patent application number 10-2006-0034104, filed on Apr. 14, 2006, which is incorporated by reference in its entirety.

BACKGROUND OF THE INVENTION

The present invention relates to a semiconductor memory device, and more particularly to a self refresh operation of a semiconductor memory device.

Data stored in a dynamic random access memory (DRAM) eventually fade unlike other semiconductor memory devices such as static random access memory (SRAM) and flash memory. Therefore, the DRAM is required to rewrite the data periodically. The rewriting operation is referred as a refresh operation. The refresh operation is performed by sensing and amplifying cell data and rewriting the amplified cell data at least once during a retention time of the cell data.

There are two operation modes of the refresh operation. The one is an auto refresh mode for performing the refresh operation during an active mode by generating internal addresses in response to an external command. The other is a self refresh mode for performing the refresh operation during a stand-by mode, e.g., a power down mode. The refresh operation is performed by generating the internal address through an internal counter in response to the external command both in the auto refresh mode and in the self refresh mode. The internal address sequentially increases at every input of the external command. Meanwhile, low power DRAMs included in mobile devices such as a portable computer, a personal digital assistant (PDA), and a mobile telephone almost necessarily employ the self refresh mode.

Usually, a refresh period tREF of the self refresh mode is determined by a period signal output from a ring oscillator included in the semiconductor memory device based on a refresh time detected through a test operation. The refresh time is detected row by row. In order to prevent a bit fail, the refresh period tREF is decided according to the row having the shortest refresh time. Herein, the refresh time is defined as the maximum duration of the cell data without the refresh operation.

FIG. 1 is a graph illustrating a bit fail rate according to the refresh time of the semiconductor memory device.

It is assumed that "t1" shown in FIG. 1 is the shortest refresh time of a semiconductor memory device and "t2" shown in FIG. 1 is a normal refresh time of the semiconductor memory device. When the shortest refresh time t1 is selected as the refresh time of the semiconductor memory device, the bit fail rate becomes about $10^{-4}$%. In the meantime, when the normal refresh time t2 is selected as the refresh time of the semiconductor memory device, the bit fail rate becomes about $10^{-2}$%. Therefore, in order to reduce the bit fail the shortest refresh time t1 is selected as the semiconductor memory device. However, when the shortest refresh time t1 becomes the refresh time of the semiconductor memory device, the refresh operation is performed too frequently. In other words, the refresh operation is unnecessarily frequently performed for the rows having the normal refresh time which is longer than the shortest refresh time and, therefore, the current consumption increases.

Meanwhile, a semiconductor memory device employing a dual period self refresh scheme is suggested in order to reduce the current consumption.

FIG. 2 is a block diagram of a conventional semiconductor memory device employing a dual period self refresh scheme.

The semiconductor memory device shown in FIG. 2 stores the refresh time of each row detected through a test operation in a programmable read only memory (PROM) mode register. Then, each cell array block ARRAY BLOCK 0, 1, 2, 3 in the semiconductor memory device selectively uses one of two refresh periods according to the refresh time stored in the PROM mode register and a refresh address A0-A11. The refresh address A0-A11 is generated base on a refresh timer, a internal RAS generator and a address counter. The semiconductor memory device is explained in detail in Dual Period Self Refresh scheme for Low Power DRAM's with On-Chip PROM Mode IEEE JOURNAL OF SOLID STATE CIRCUIT, VOL. 33, NO. 2, FEBRUARY 1998. Therefore, the detailed explanation about circuitry and operation thereof will be eliminated. By using the dual period self refresh scheme, the unnecessary current consumption can be reduced. However, the scheme requires the PROM, and it is actually impossible to contain the PROM, which is a non-volatile memory, in the DRAM chip.

SUMMARY OF THE INVENTION

Embodiments of the present invention are directed to provide a semiconductor memory device for employing a self refresh method reducing a current consumption.

In accordance with an aspect of the present invention, there is provided a semiconductor memory device, including: a plurality of first storing means, each of which is configured to store a refresh time of each corresponding row included in a cell array; a plurality of second storing means, each of which is configured to store column data of the corresponding row when the refresh time of the corresponding row is detected; an oscillator configured to generate a minimum refresh period signal in a self refresh mode; a counter configured to generate sequential internal refresh addresses in the self refresh mode; and a refresh period controller configured to generate a set refresh period signal, wherein it is determined based on a value stored in the first storing means and the set refresh period signal whether a refresh operation is performed on the corresponding row or not.

In accordance with another aspect of the present invention, there is provided a method for driving a semiconductor memory device, comprising: initializing first data corresponding to a refresh time of each corresponding row included in a cell array; storing second data corresponding to column data included in the first row of the cell array after entering a self refresh mode; setting the first data corresponding to the first row by detecting the refresh time of the first row while performing refresh operations on the other rows in the cell array according to a refresh period selected based on the corresponding first data for predetermined refresh cycles, wherein the refresh operation is not performed on the first row during the predetermined refresh cycles; restoring the second data to the first row; and repeating the above steps for the other rows in the cell array to thereby set the corresponding first data until the setting step is completed for all rows in the cell array or the self refresh mode expires.

In accordance with a further another aspect of the present invention, there is provided a method for driving a semiconductor memory device, including: initializing first data corresponding to a refresh time of each corresponding row included in a cell array; storing second data corresponding to column data included in the first row of the cell array whose corresponding first data is not set after entering a self refresh mode; setting the first data corresponding to the first row by detecting the refresh time of the first row while performing refresh operations on the other rows in the cell array according to a refresh period selected based on the corresponding first data for a predetermined refresh cycles, wherein the refresh operation is not performed on the first row during the predetermined refresh cycles; inverting the second data; restoring the inverted second data to the first row; first repeating the steps from storing step to restoring step; and repeating the steps from storing step to first restoring step for the other rows in the cell array whose corresponding first data is not set to thereby set the corresponding first data until the setting step is completed for all rows in the cell array or the self refresh mode expires.

DESCRIPTION OF SPECIFIC EMBODIMENTS

The present invention provides a self refresh mode of various refresh periods. For this, the present invention detects a refresh time of each row through a predetermined test operation and stores a detection result, i.e., the refresh time of each row, to a register. Thereafter, a self refresh operation is performed on the row with a refresh period determined based on the refresh time.

Figure 1:
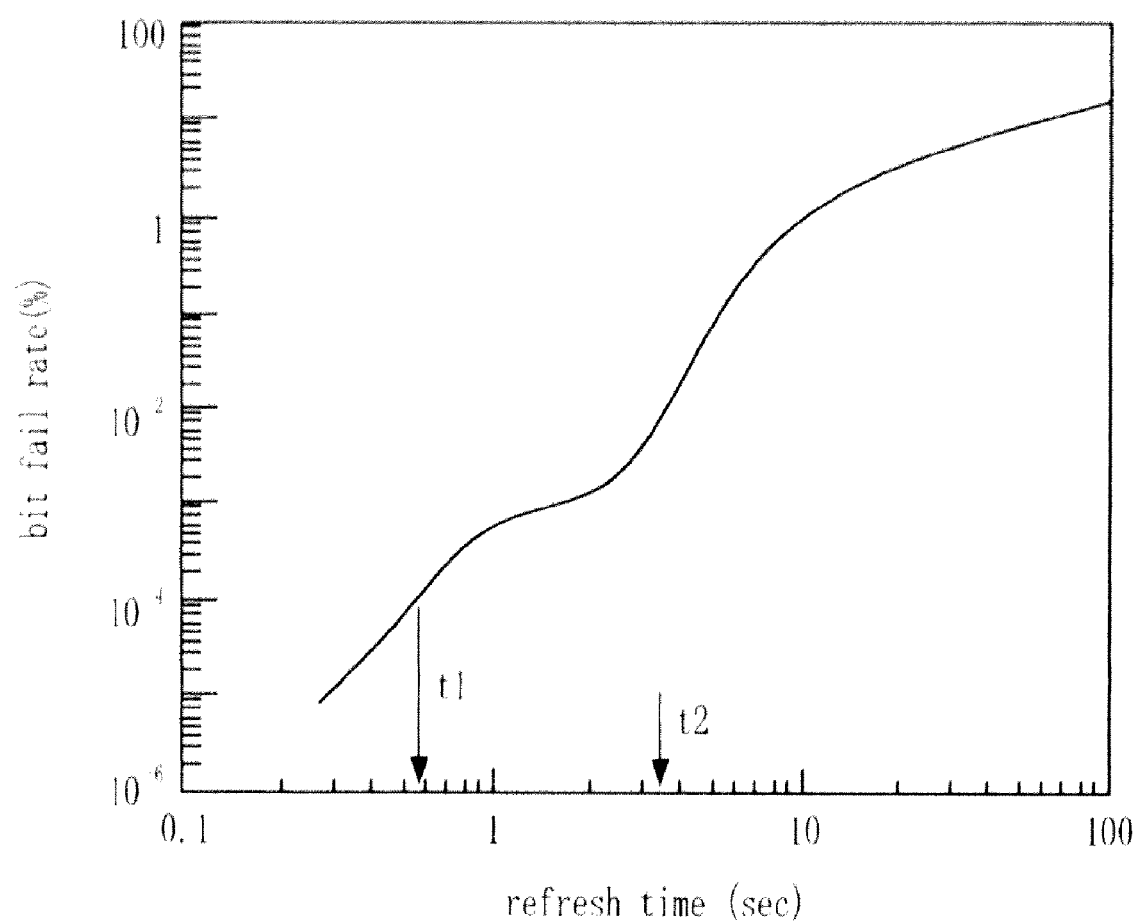
FIG. 1 is a graph illustrating a bit fail rate according to a refresh time of a semiconductor memory device.
Figure 2:
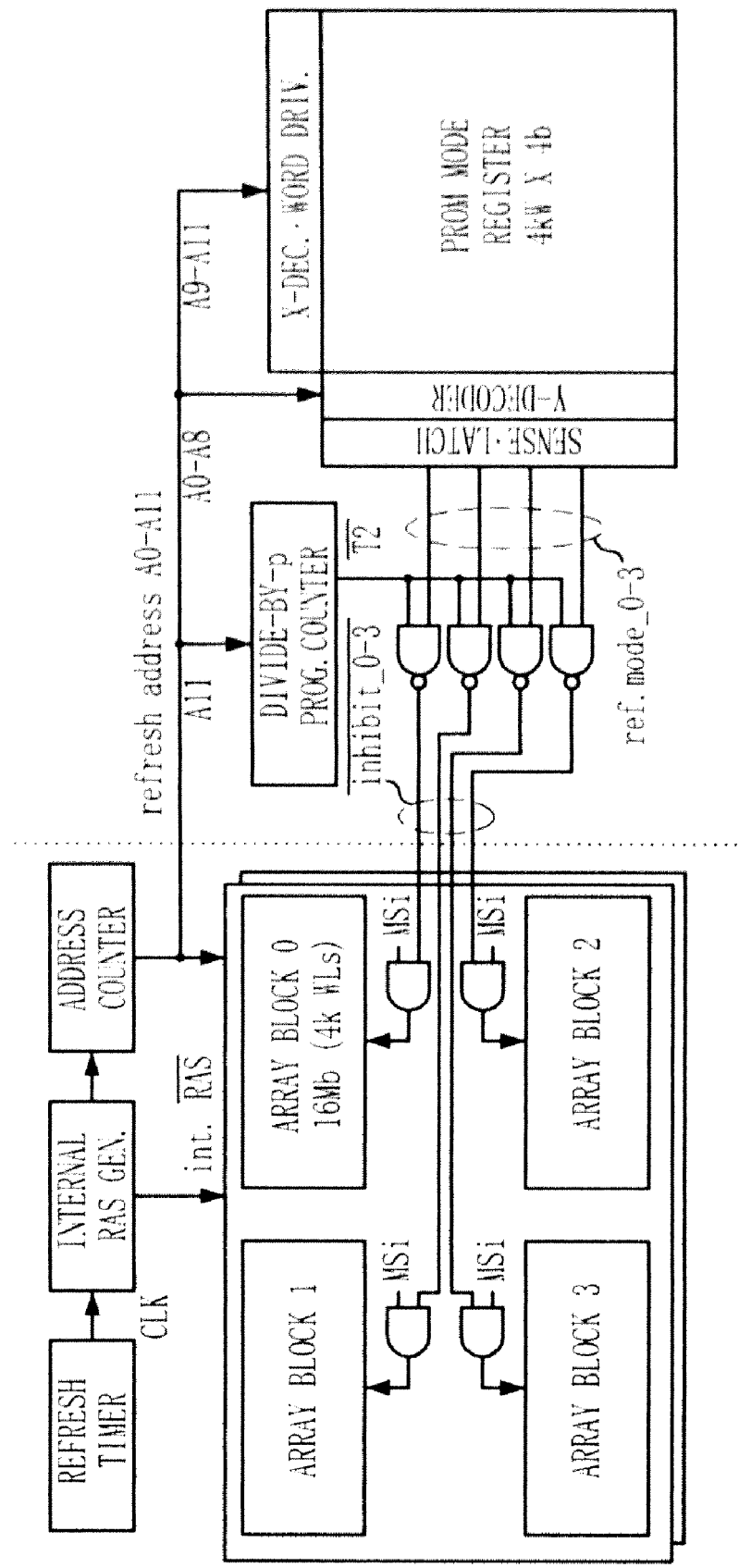
FIG. 2 is a block diagram of a conventional semiconductor memory device employing a double period self refresh method.
Figure 3:
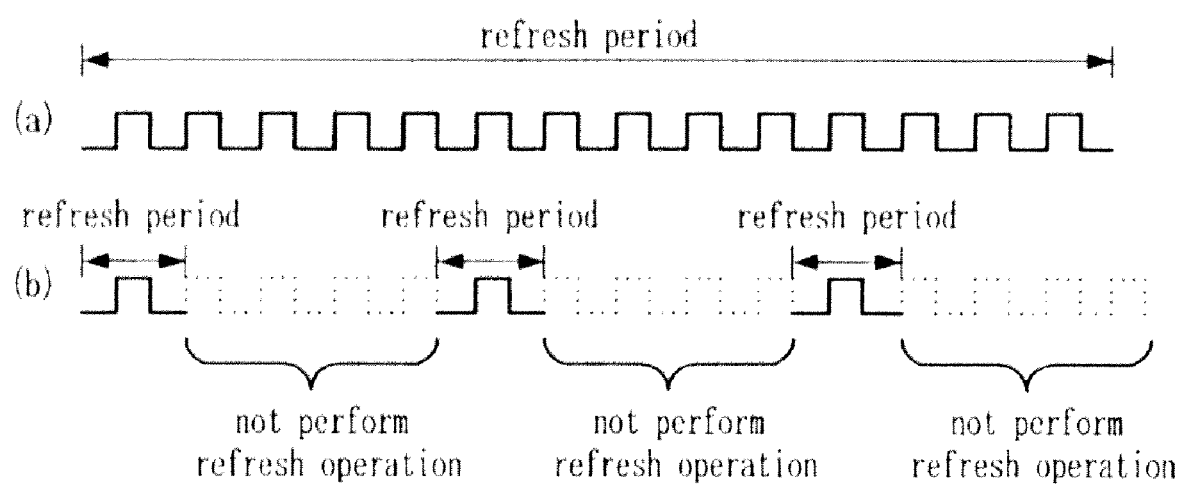
FIG. 3 is a waveform describing an operation scheme of the present invention.

FIG. 3 is a waveform describing an operation scheme of the present invention.

(a) shows the refresh period of the row having the shortest refresh time; and (b) shows the refresh period of the row having the normal refresh time. Hereinafter, the refresh period of the row having the shortest refresh time is referred to as a worst refresh period tREF; and the refresh period of the row having the normal refresh time is a normal refresh period. Further, the row having the shortest refresh time is referred to as a worst row; and the row having the normal refresh time is referred as a normal row, hereinafter. The refresh operation for the normal row is not performed for a predetermined period. Therefore, when the worst refresh period tREF is T, the normal refresh period becomes K×T Herein. K is a positive integer. As mentioned above, the present invention performs the test operation for detecting the refresh time of each row in the bank and performs the refresh operation with various refresh period determined based on the refresh time.

Figure 4:
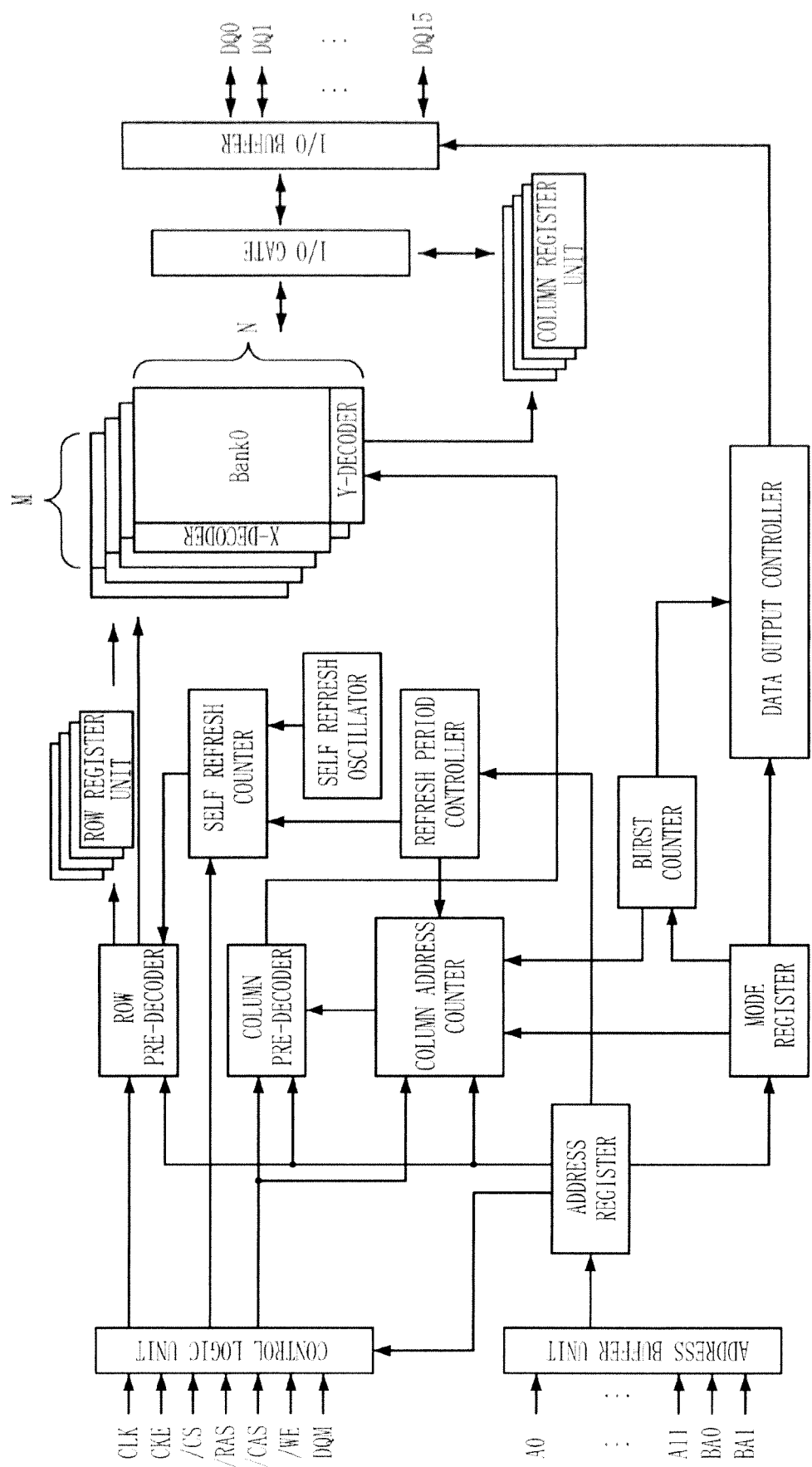
FIG. 4 is a block diagram of a semiconductor memory device employing a self refresh scheme in accordance with an embodiment of the present invention.

FIG. 4 is a block diagram of a semiconductor memory device employing a self refresh scheme in accordance with an embodiment of the present invention.

The semiconductor memory device includes a plurality of banks, e.g., BANK0, a control logic unit, an address buffer unit, an address register, a row pre-decoder, a column pre-decoder, a mode register, a burst counter, a column address counter, an input/output (I/O) buffer, an I/O gate, and a data output controller. Each bank includes a memory cell array, a sense amplifier array, an X-decoder, and a Y-decoder. The control logic unit decodes external commands CLK, CKE, /CS, /RAS, /CAS, /WE, and DQM and generates internal control signals. The address buffer buffers external addresses A1 to A11, BA0, and BA1. The address register latches an address signal output from the address buffer unit. The row pre-decoder pre-decodes a row address. The column pre-decoder pre-decodes a column address. The mode register sets an operation mode according to a code input through an address pin when a mode register set command is input. The burst counter counts the number corresponding to a burst length which is set by the mode register. The column address counter counts the column address in response to outputs of the mode register and the burst counter. The I/O buffer buffers I/O data DQ0-DQ15. The I/O gate controls a data transmission between the I/O buffer and the banks. The data output controller controls the I/O buffer in response to the outputs of the mode register and the burst counter.

Meanwhile, the semiconductor memory device further includes a self refresh oscillator and a self refresh counter. The self refresh oscillator generates a minimum self refresh period signal for a self refresh mode. The minimum self refresh period signal has the worst refresh period tREF. The self refresh counter generates serial internal refresh addresses for the self refresh mode. Further, the semiconductor memory device includes a plurality of row register units, a plurality of column register units, and a refresh period controller. Each of the row register units stores a refresh time of a corresponding row included in the banks. Each of the column register units stores data of the selected row included in the banks. The refresh period controller generates a set refresh period signal SREF set by the mode register. A period of the set refresh period signal SREF is a set refresh period. The set refresh period signal SREF is used for the normal rows and the minimum self refresh period signal is used for the rows having the refresh time shorter than the normal refresh time. Hereinafter, the refresh time shorter than the normal refresh time is referred as a bad refresh time; and the row having the bad refresh time is referred as a bad row.

The row register units and column register units are allocated each of the banks, respectively. Thus, if the semiconductor memory device includes four banks BANK0 to BANK3 as shown in FIG. 4, four row register units and four column register units are included. Each of the row register units includes a plurality of row registers, each of which is assigned to a corresponding row of the bank. Each of the column register units includes a plurality of column registers, each of which is assigned to a corresponding column of the selected row. Thus, when each bank has an N×M formation, each of the row register units includes N number of the row registers and each of the column register units includes M number of the column registers.

Figure 5:
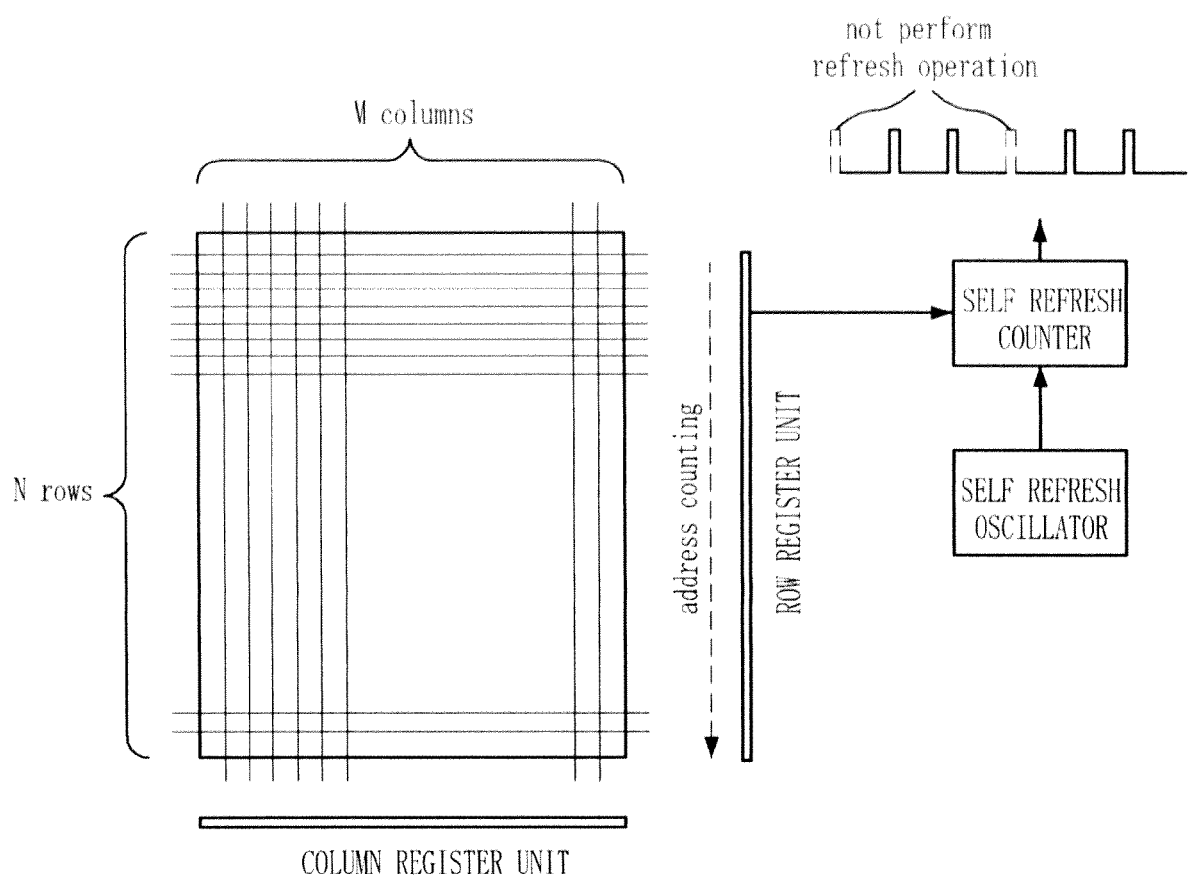
FIG. 5 is a diagram illustrating a schematic structure of the bank shown in FIG. 4 and an operation of the semiconductor memory device including it.

FIG. 5 is a diagram illustrating a schematic structure of the bank shown in FIG. 4 and an operation of the semiconductor memory device including it.

As mentioned above, the semiconductor memory device detects the refresh time of the bank row by row, i.e., in the direction of address counting, and stores a detection result in the row register unit. In detail, the row register in the row register unit stores "1" if the corresponding row has a normal refresh time. On the contrary, the row register stores "0" when the corresponding row has the bad refresh time. That is, data stored in the row register unit are used as flags for determining whether to perform a refresh operation on the corresponding row or not. Herein, self refresh counter and self refresh oscillator of FIG. 5 correspond to self refresh counter and self refresh oscillator shown FIG. 6 is waveform describing a self refresh operation of the semiconductor memory device shown in FIG. 4.

Figure 6:
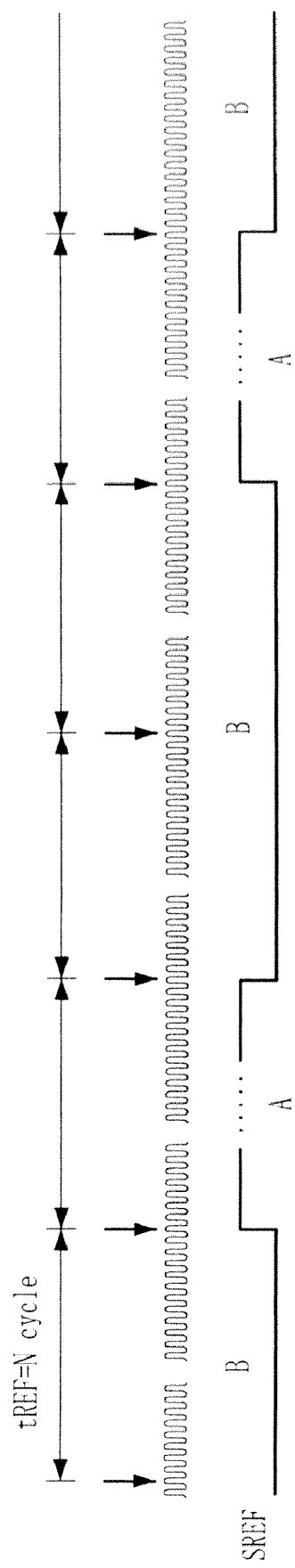
FIG. 6 is waveform describing a self refresh operation of the semiconductor memory device shown in FIG. 4.

Specifically, FIG. 6 shows a waveform of the set refresh period signal SREF whose period is three times that of the minimum self refresh period signal. That is, the set refresh operation is three times the worst refresh period tREF. In this case, the set refresh period is 3×N cycles, wherein N cycle denotes the worst refresh period tREF and corresponds to the number of rows included in one bank. An active length of the set refresh period signal SREF corresponds to N cycle. During an "A" sector, where the set refresh period signal SREF is active as a logic high level, the refresh operation is performed for every row in the bank without concerning the data stored in the row register unit. On the contrary, during a "B" sector, where the set refresh period signal SREF is inactive as a logic low level, the refresh operation is performed in response to the data stored in the row register unit. In detail, the refresh operation is performed for the row when "0" is stored in the corresponding row register of the row register unit. Further, when "1" is stored in the corresponding row register of the row register unit, the refresh operation is not performed for the row. That is, the refresh operation is performed only for the rows having the bad refresh time when the set refresh period signal SREF is inactive. As a result, the current consumption caused by the refresh operation for the normal rows is reduced by ⅓ in case of FIG. 6.

Figure 7:
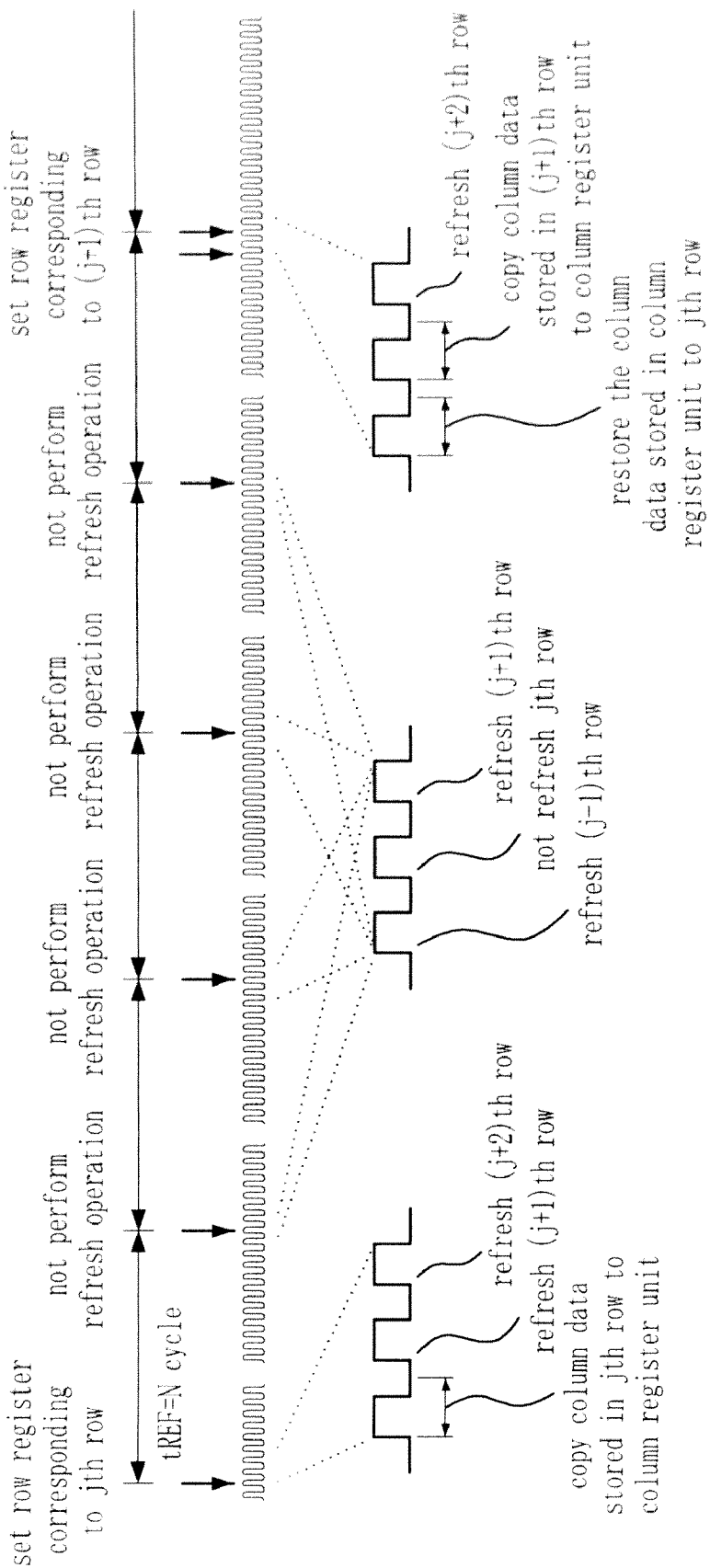
FIG. 7 is a waveform illustrating a set method of refresh period of the semiconductor memory device in accordance with an embodiment of the present invention.

FIG. 7 is a waveform illustrating a set method of refresh period of the semiconductor memory device in accordance with an embodiment of the present invention.

When the self refresh mode is started, the semiconductor memory device starts to perform the refresh operation. When the self refresh operation is performed, the refresh time of each row is detected. Herein, the row registers included in the row register unit have been initialized with "0" when the previous self refresh mode is finished. Assuming that the first row of a bank is the jth row, the column data of the jth row are copied to the corresponding column register unit. The refresh operations for the other rows, e.g., (j+1)th row and (j+2)th row, in the bank are subsequently performed.

During a predetermined period, five worst refresh periods tREF in case of FIG. 7, the refresh operation for the jth row is not performed and the column data stored in the jth row are compared with the column data stored in the column register unit. When the column data stored in the jth row are the same as those stored in the column register unit, the jth row is considered to have the normal refresh time and "1" is stored to the corresponding row register. On the other hand, when the column data stored in the jth row are different from those stored in the column register unit, the jth row is considered to have the bad refresh time and, therefore, "1" is stored to the corresponding row register. After the predetermined period, the column data stored in the column resister unit are restored to the ith row.

Meanwhile, after the refresh time of the jth row is determined, the refresh time of the (j+1)th row is detected through the method abovementioned. While determining the refresh time of each row through the abovementioned method, the refresh operation for each row is performed based on the data stored in the row register unit. For example, in case of FIG. 7, the refresh operation for a row whose corresponding row register stores "1" is performed for every set refresh period, e.g., five worst refresh periods tREF for the case shown in FIG. 7. On the other hand, the refresh operation for a row whose corresponding row register stores "1" is performed for every worst refresh period tREF. While setting the refresh time of each row, the current consumption caused by the refresh operation is gradually reduced. At last, when the setting of the refresh time of every row in the bank is completed, the current consumption caused by the refresh operation is converged to a minimum value. Hereinafter, the method for setting the refresh time of each row shown in FIG. 7 is referred to as a mode A method.

If the mode A method is employed to set the refresh period of each row, the row register unit is initialized to "0" whenever the self refresh mode is closed. Therefore, the procedure for setting the refresh time of each row is newly started for a new self refresh mode.

Meanwhile, the semiconductor memory is operated in a normal active mode before entering a new self refresh mode. During the normal active mode, the semiconductor memory device performs read and write operations. If the semiconductor memory device performs the write operation during the normal active mode, there is a possibility that data stored in the rows are changed. If the mode A method is used for the self refresh mode, the refresh time of each row is newly detected for each self refresh mode as mentioned above. Thus, the row register units store correct refresh time without concern as to whether the write operation is performed or not during the normal active mode.

Figure 8:
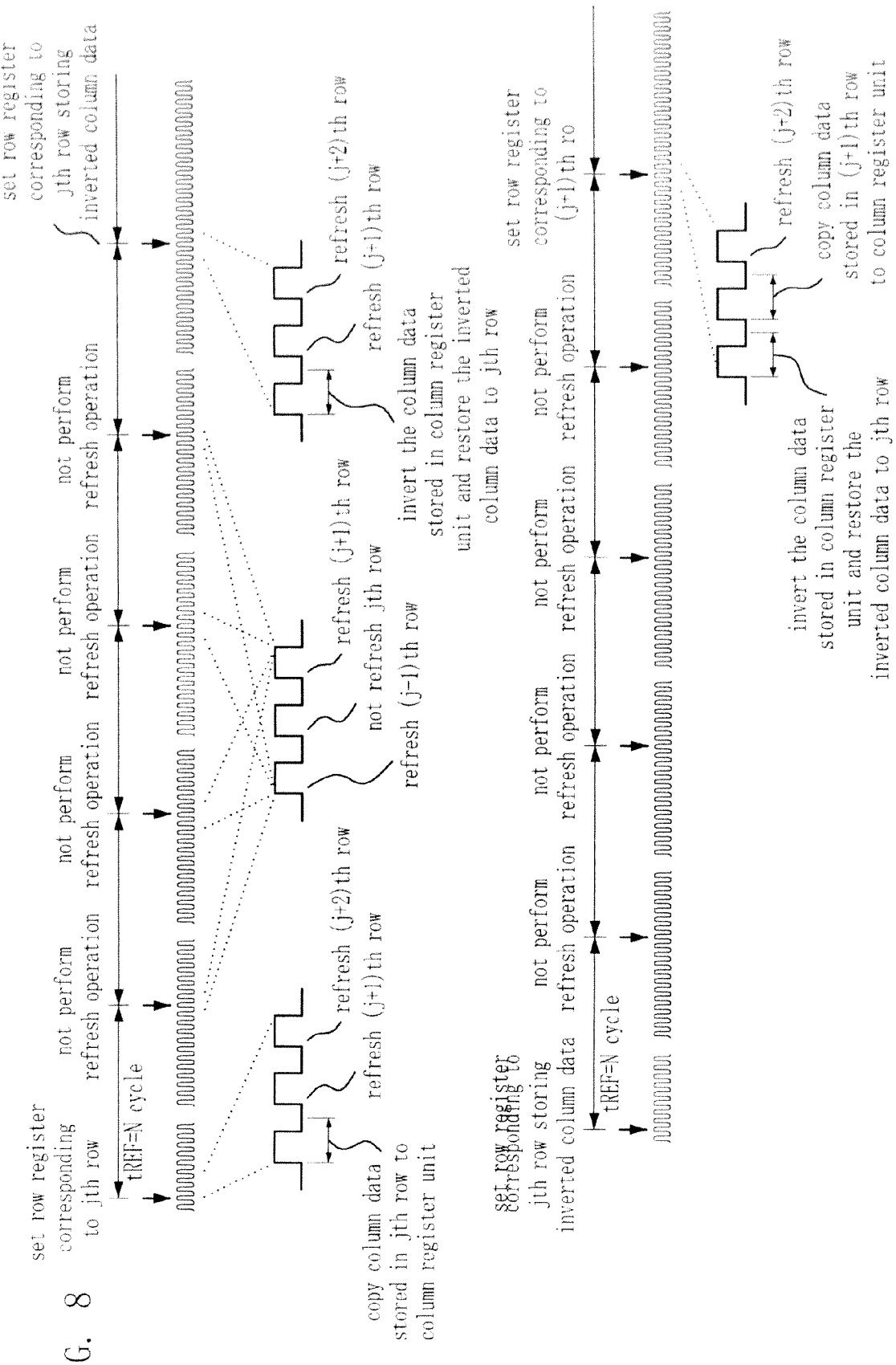
FIG. 8 is a waveform illustrating a set method of refresh period of the semiconductor memory device in accordance with another embodiment of the present invention.

FIG. 8 is a waveform illustrating a set method of refresh period of the semiconductor memory device in accordance with another embodiment of the present invention. Hereinafter, the set method of refresh period shown in FIG. 8 is referred to as a mode B method.

Similar to the mode A method, the refresh operation is started when the self refresh mode is started in the mode B method. While the self refresh operation is performed, the refresh time of each row is detected. However, compared to mode A method, it is different because the row registers in the row register unit are not initialized when the self refresh mode is closed for the mode B method. That is, the row registers set in the previous self refresh mode hold the data stored therein. Therefore, when the self refresh mode is started, the semiconductor memory device employing the mode B method starts to detect a refresh time from the row which is placed right after the row whose refresh time has already been detected in the previous self refresh mode. If detection of the refresh time of every row in the banks is completed in the previous self refresh mode, the semiconductor memory device does not need to detect the refresh time of each row.

Referring to FIG. 8, it is assumed that the refresh time of the (j−1)th row is detected during the previous self refresh mode. Therefore, when the current self refresh mode is started, the detection of the refresh time is started from the jth row.

First, the column data stored in the jth row are copied to the corresponding column register unit. The refresh operations for the other rows, e.g., (j+1)th row and (j+2)th row, in the bank are subsequently performed. During a predetermined period, e.g., five worst refresh periods tREF in case of FIG. 7, the refresh operation for the jth row is not performed and the column data stored in the jth row are compared with the column data stored in the column register unit. When the column data stored in the jth row are the same as those stored in the column register unit, the jth row is considered to have the normal refresh time and "1" is stored to the corresponding row register. On the other hand, when the column data stored in the jth row are different from those stored in the column register unit, the jth row is considered to have the bad refresh time and, therefore, "0" is stored to the corresponding row register. After the predetermined period, the column data stored in the column register unit are restored to the jth row. Herein, the column data stored in the column register unit is firstly inverted and, then, restored to the jth row.

Meanwhile, the refresh time of the jth row storing the inverted column data is again detected. The inverted column data stored in the jth row is copied to the corresponding column register unit. The refresh operations for the other rows, e.g., (j+1)th row and (j+2)th row, in the bank are subsequently performed. During a predetermined period, e.g., five worst refresh periods tREF, the refresh operation for the jth row is not performed and the inverted column data stored in the jth row are compared with the inverted column data stored in the column register unit. When the inverted column data stored in the jth row are the same as those stored in the column register unit, the jth row is considered to have the normal refresh time and "1" is stored to the corresponding row register. On the other hand, when the inverted column data stored in jth row are different from those stored in the column register unit, the jth row is considered to have the bad refresh time and, therefore, "0" is stored to the corresponding row register. After the predetermined period, the inverted column data stored in the column register unit are inverted and restored to the jth row. In this way, the setting of the refresh time of the jth row is completed.

After the refresh time of the jth row is set, the refresh time of the (j+1)th row is detected through the method mentioned above. While setting the refresh time of each row through the abovementioned method, the refresh operation for each row is performed based on the data stored in the row register unit. The refresh operation for a row whose corresponding row register stores "1" is performed for every predetermined period, e.g., five worst refresh period tREF. On the other hand, the refresh operation for a row whose corresponding row register stores "0" is performed for every worst refresh period tREF. While setting the refresh time of each row, the current consumption caused by the refresh operation is gradually reduced. At last, when the setting of the refresh time of every row in the bank is completed, the current consumption caused by the refresh operation is converged to a minimum value.

If the mode B method is employed for setting the refresh time of the rows in the bank, the data stored in the row register unit is not initialized although the current self refresh mode expires. However, as mentioned above, the semiconductor memory device performs read and write operations during the normal active mode. If the semiconductor memory device performs the write operation during the normal active mode, there is a possibility that data is stored in rows in the bank. Therefore, when the mode B method is employed for setting the refresh time of the rows, it is required to invert the data stored in the rows and redetect the refresh time of the rows in order to obtain a responsible refresh time set result.

Figure 9:
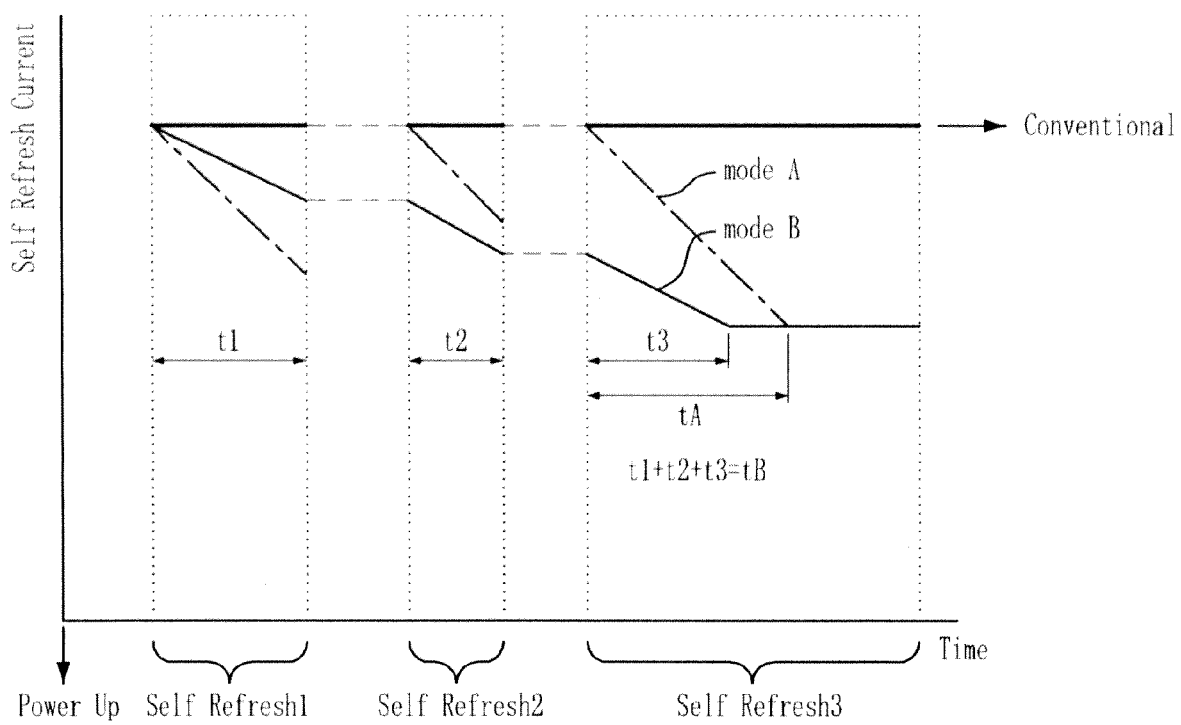
FIG. 9 is a diagram showing a self refresh current consumption characteristic according to the set methods of refresh periods shown in FIGS. 7 and 8.

FIG. 9 is a diagram showing a self refresh current consumption characteristic according to the set methods of refresh period shown in FIGS. 7 and 8. Herein, t1 in FIG. 9 is a time during a self refresh1 operation, t2 in FIG. 9 is a time during a self refresh2 operation, and t3 in FIG. 9 is a term that the self refresh current is reduced in operation period of a self refresh3 according to mode B. Moreover, tA in FIG. 9 is a term that the self refresh current is reduced in operation period of a self refresh3 according to mode A.

As shown, the current consumption caused by the refresh operation both in the mode A method and in the mode B method is gradually reduced as the self refresh operation proceeds from a power up operation (Power Up). Therefore, it is possible for the present invention to reduce the current consumption caused by the refresh operation compared with the conventional art (Conventional).

Meanwhile, for the mode A method, the current consumption caused by the refresh operation rapidly decreases because the setting of the refresh time for the rows storing inverted column data is not required. However, because the data stored in the row register unit is initialized when the self refresh mode expires, a single duration of the self refresh mode needs to be sufficiently long, as much as tA, for the current consumption caused by the refresh operation to get the minimum value. Accordingly, it is advantageous to employ the mode A method for systems whose duration of the self refresh mode is long or which frequently performs power up/down operation.

For the mode B method, the current consumption caused by the refresh operation more slowly decreases compared with the case of the mode A method because the setting of the refresh time for one row requires two detection processes. That is, the detection operation is performed for each row when it stores the column data and when it stores the inverted column data. Therefore, it takes more time, i.e., tB shown in FIG. 9, for the current consumption caused by the refresh operation to reach the minimum value in the mode B method. However, the current consumption caused by the refresh operation in the mode B method holds the minimum value once it reaches the minimum value. Accordingly, the mode B method is useful for systems whose duration of the self refresh mode is short or which rarely performs the power up/down operation.

In the meantime, it is also possible to draw a new set method by combining the mode A method and the mode B method in order to obtain advantages thereof. The present invention suggests the set method which will be described below.

Figure 10:
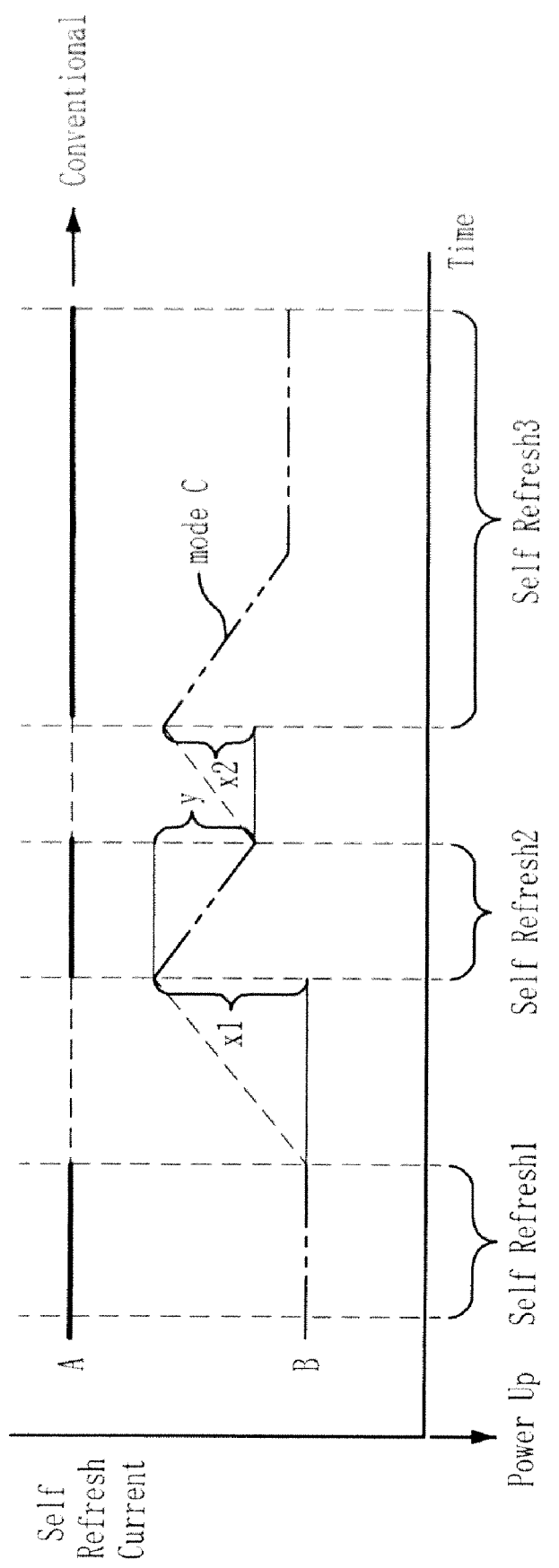
FIG. 10 is a diagram showing a self refresh current consumption characteristic of a set method in accordance with still another embodiment of the present invention.

FIG. 10 is a diagram showing a self refresh current consumption characteristic of a set method in accordance with still another embodiment of the present invention. Hereinafter, the set method of refresh period described in FIG. 10 is referred to as a mode C method.

For the mode C method, the row registers included in the row register unit is initialized to "1" in response to a power up operation (Power Up). Then, the row registers store new data set by detecting the refresh time of each row in the bank, and maintain the data although the self refresh mode is expired similar to the mode B method. While the detection for the row storing the inverted column data is not performed, the data of the row register is set to "0" similar to the mode A method if the write operation is performed to the corresponding row during the normal active mode. Through this, reliability for the set result of the row register unit can be obtained.

In case of the mode C method, the rows whose corresponding row register stores "0" are tested in order to detect their refresh time without concern whether the data stored in the row registers are obtained by the detection operation or the write operation.

Referring to FIG. 10, the current initially consumed by the refresh operation, i.e., Self Refresh1, is less than the minimum value because the row registers are initialized to "1" in response to the power up operation. In the next self refresh mode, the current consumption caused by the refresh operation increases because of the write operation performed during the normal active operation. The current increase caused by the write operation is denoted as x1 and x2 in FIG. 10. Then, the current consumption caused by the refresh operation, i.e. Self Refresh2, decreases because of the detection operation of the refresh time of the rows in the bank. The current decrease caused by the detection operation is denoted as y in FIG. 10. As shown, the current consumption caused by the refresh operation, i.e., Self Refresh3, is converged to a minimum value when the detection operation performed for every row in the bank. Therefore, it is possible for the present invention to reduce the current consumption caused by the refresh operation compared with the conventional art (Conventional).

Meanwhile, there is possibility that the column data stored in the adjacent rows of the row which is written during the normal active mode can be distorted. Therefore, in order to increase the reliability, the row registers corresponding to the adjacent rows as well as the row storing the write data are set to "0" in another embodiment. The number of the adjacent rows can be determined according to the system requirement. In still another embodiment, the row registers can be initialized to "0" in response to the power up operation.

Hereinafter, examples of mode register set (MRS) codes for applying the abovementioned set methods are suggested.

TABLE 1

| A2 | A1 | A0 | K |
|----|----|----|---|
| 0 | 0 | 0 | 1 |
| 0 | 0 | 1 | 2 |
| 0 | 1 | 0 | 3 |
| 0 | 1 | 1 | 4 |
| 1 | 0 | 0 | 5 |
| 1 | 0 | 1 | 6 |
| 1 | 1 | 0 | 7 |
| 1 | 1 | 1 | 8 |

Three bits, i.e., A0 to A2, of the MRS code are used for setting K. Herein, K denotes the set refresh period. When the K is 1, the set refresh period has the same as the worst refresh period. In the case shown in FIGS. 7 and 8, the set refresh period is five times longer than the worst refresh period tREF and, therefore, the K is 5. Thus, the three bits, i.e., A2 to A0, of the MRS code are set to 100 in the case shown in FIGS. 7 and 8.

TABLE 2

| A4 | A3 | Self refresh margin |
|----|----|---------------------|
| 0 | 0 | 0 |
| 0 | 1 | 1 |
| 1 | 0 | 0 |
| 1 | 1 | 1 |

Two bits, i.e. A3 and A4, of the MRS code are used for setting a self refresh margin. The self refresh margin is defined by the following formula.

Self refresh margin=$K-L$    <formula 1>

Herein, L denotes the actual refresh period of the row having the no refresh time compared with the minimum self refresh period signal. As the self refresh margin is greater, it is expected that the bit fail rate decreases.

TABLE 3

| A6 | A5 | Self refresh mode |
|----|----|-------------------|
| 0 | 0 | Conventional mode |
| 0 | 1 | Mode A |
| 1 | 0 | Mode B |
| 1 | 1 | Mode C |

Two bits, i.e., A5 and A6, of the MRS code are used for selecting the set method of the refresh period. When the two bits, i.e., A6 and A5, are set to "00", the self refresh operation is performed with a single refresh period without concerning the refresh time of each row. Further, it is possible to select one of the mode A, mode B, and mode C according to the system requirement.

TABLE 4

| A8 | A7 | The number of adjacent rows |
|----|----|-----------------------------|
| 0 | 0 | 0 |
| 0 | 1 | 1 |
| 1 | 0 | 2 |
| 1 | 1 | 3 |

The two bits, i.e., A7 and A8, of the MRS code are used for determining the number of the adjacent rows whose corresponding row registers are set to "0" when the write operation is performed on a certain row during the normal active mode. For example, when the two bits, i.e., A8 and A7, are set to "11" and a data is written to a certain row during the normal active mode, the row registers corresponding to the three rows adjacent to the row storing the write data are set to "0". As the number of adjacent rows increases, the reliability also increases.

As mentioned above, the present invention provides a method for reducing a current consumption caused by a self refresh operation. Accordingly, by using the method in accordance with the present invention, it is possible to minimize the size of mobile devices which employ the self refresh operation.

While the present invention has been described with respect to the specific embodiments, it will be apparent to those skilled in the art that various changes and modifications may be made without departing from the spirit and scope of the invention as defined in the following claims. For example, the internal structure of the semiconductor memory device employing the method for reducing the current consumption can be implemented in various ways. Further, in abovementioned embodiment, the refresh operation is performed according to the set refresh period signal SREF when the corresponding row register stores "1" and performed according to the minimum self refresh period signal when the corresponding row register stores "0". However, in another embodiment, it is also possible to perform the refresh operation according to the set refresh period signal SREF when the corresponding row register is set to; and to perform the refresh operation according to the minimum self refresh period signal when the corresponding row register is set to "1".

What is claimed is:

1. In a semiconductor memory device having a plurality of banks, each said bank including an array of rows and columns, said rows each having a row register unit including a row register corresponding to each said row, and said columns each having a column register unit including a column register corresponding to each said column, a method for determining a refresh time for each said row comprising:

determining if a set refresh period signal is inactive;

if said set refresh period signal is inactive, performing a refresh operation for a row only when a "0" is stored in the corresponding row register of the row register unit.

2. The method defined in claim 1 wherein said corresponding row register is stored with a "1" when column data stored in a predetermined row are the same as data stored in said column register unit and said corresponding row register is stored with a "0" when said column data stored in a predetermined row are not the same as data stored in said column register unit.

* * * * *